United States Patent [19]
Chang et al.

[11] Patent Number: 6,072,225
[45] Date of Patent: Jun. 6, 2000

[54] MICROELECTRONIC DEVICES HAVING INTERCONNECTS WITH PLANARIZED SPUN-ON GLASS REGIONS

[75] Inventors: Seung-hyun Chang, Kyungki-do; Suck-tae Kim, Seoul; Young-hun Park, Kyungki-do, all of Rep. of Korea

[73] Assignee: Samsung Electronics Co., Ltd., Rep. of Korea

[21] Appl. No.: 08/929,591

[22] Filed: Sep. 15, 1997

[30] Foreign Application Priority Data

Jan. 30, 1997 [KR] Rep. of Korea .................. 97-2895

[51] Int. Cl.[7] ..................... H01L 31/00; H01L 23/58; H01L 23/48; H01L 23/52
[52] U.S. Cl. ..................... 257/466; 257/496; 257/635; 257/750; 257/752
[58] Field of Search .................. 257/324, 466, 257/96, 635, 750, 752

[56] References Cited

U.S. PATENT DOCUMENTS

| | | | |
|---|---|---|---|
| 5,384,483 | 1/1995 | Huang | 257/635 |
| 5,465,003 | 11/1995 | Lur et al. | 257/635 |
| 5,777,258 | 7/1998 | Yajima | 257/324 |

FOREIGN PATENT DOCUMENTS 405145047   6/1993   Japan .................. 257/635

*Primary Examiner*—Mahshid Saadat
*Assistant Examiner*—Jesse A. Fenty
*Attorney, Agent, or Firm*—Myers Bigel Sibley & Sajovec

[57] ABSTRACT

An interconnect in a microelectronic device is formed by forming a first mesa on a substrate. A first insulation layer is then formed on the substrate, the first insulation layer covering the first mesa to define a step at an edge thereof. A second mesa is formed on the first insulation layer adjacent the step, the second mesa being lower than the step. A second insulation layer is formed on the substrate, covering the second mesa and forming a step in the second insulation layer overlying the step in the first insulation layer. A spun-on-glass (SOG) layer on the second insulation layer, and then is planarized to expose a first portion of the second insulation layer at the step in the second insulation layer and to expose a second portion of the second insulation layer overlying the second mesa, thereby defining a planarized SOG region between the step and the second mesa. A third insulation layer is formed on the substrate, covering the planarized SOG region, and portions of the second and third insulation layers overlying the second mesa are then removed to expose a portion of the second mesa. An interconnecting region is formed on the second insulation layer which extends through the second and third insulation layers to contact the exposed portion of the second mesa. Microelectronic devices so formed are also discussed.

17 Claims, 5 Drawing Sheets

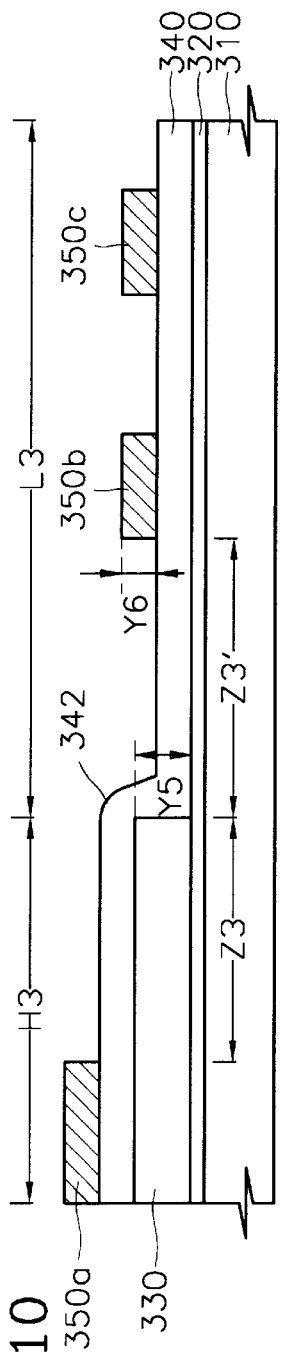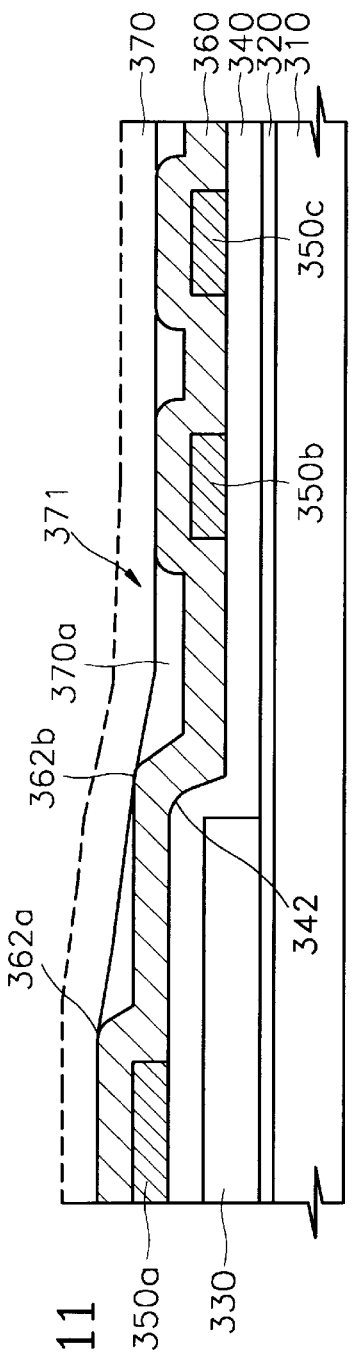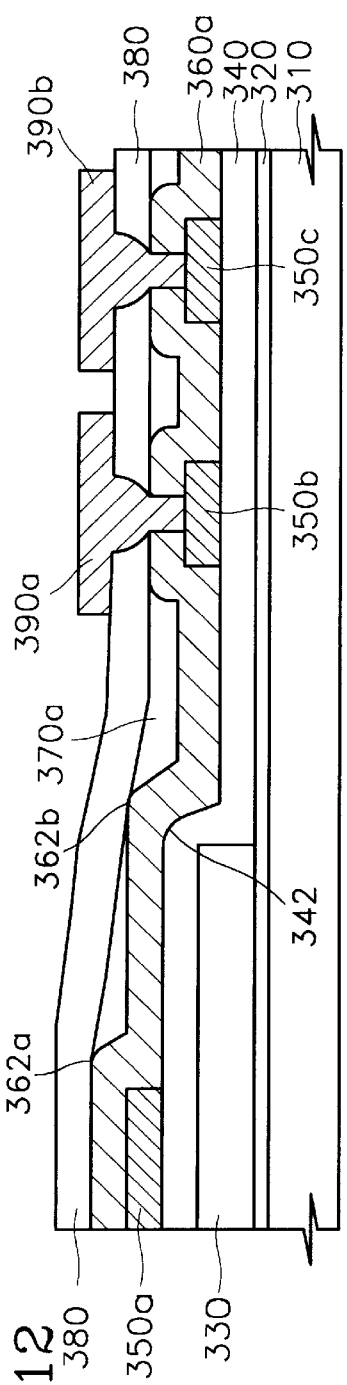

MICROELECTRONIC DEVICES HAVING INTERCONNECTS WITH PLANARIZED SPUN-ON GLASS REGIONS

FIELD OF THE INVENTION

The present invention relates to microelectronic devices and fabrication methods therefor, more particularly, to interconnects for microelectronic devices and fabrication methods therefor.

BACKGROUND OF THE INVENTION

As the integration level of microelectronic devices increases, interconnects for these devices, which can significantly influence the speed, product yield, and reliability of the device, increasingly employ a multi-layered structure. Conventional techniques for forming such a multilevel interconnect typically employ a planarization process to increase resolution and depth-of-focus in photolithography. In particular, a planarization process using spun-on-glass (SOG) has been widely applied because of advantages of low cost, process simplification, no need for a poisonous gas, and tendency to form a low defect density when compared with other planarization processes.

In a typical planarization process using SOG, liquid SOG is coated on a semiconductor substrate to form an SOG layer, which is then baked in a range of 150–400° C. to remove solvents and moisture. During this process, the SOG is condensed and tensile stresses may develop in the SOG layer, producing fine cracks in the SOG layer, especially in SOG layers having thicknesses of 3,000 Å or more.

The SOG layer tends to form more thickly in areas adjacent to the edge of a semiconductor wafer. As thin films are continuously deposited, very large steps, that is, steps of 2.0 µm or more, may be formed between the edge of a semiconductor wafer and adjacent areas for forming devices thereon, as the edge of the semiconductor wafer typically is not exposed in photolithography. Consequently, an SOG layer formed in this area may have a thickness of 2.0 µm or more, and thus may be more susceptible to cracks.

To reduce formation of such fine cracks, an organic SOG containing an organic group such as a methyl ($CH_3$) group or a phenyl ($C_6H_5$) group is usually used instead of an inorganic SOG which lacks such a group. However, organic SOG typically is more volatile and harder to contain than inorganic SOG.

FIGS. 1–3 are cross-sectional views showing a conventional method for forming a multilevel interconnects in a semiconductor device. Referring to FIG. 1, a conductive pattern 30 is formed on a semiconductor substrate 10 having a first insulation layer 20 formed thereon. A second insulation layer 40 is then formed to a uniform thickness on the overall surface of the resultant structure, covering the conductive pattern 30. Steps are typically formed in the second insulation layer pattern 40 due to the presence of the conductive pattern 30. A first area H is defined where the height between the surface of the semiconductor substrate 10 and the surface of the second insulation layer 40 is relatively high, and a second area L is defined where the height is relatively low.

Subsequently, lower conductive patterns 50a, 50b, and 50c are formed on the second insulation layer 40. Here, the first lower conductive pattern 50a is formed in the first area H, and the second and third lower conductive patterns 50b and 50c are formed in the second area L. The second lower conductive pattern 50b is positioned between the first and third lower conductive patterns 50a and 50c.

A third insulation layer 60 is formed, covering lower conductive patterns 50a, 50b, and 50c. An SOG layer 70 is then formed by coating an inorganic or organic SOG on the third insulation layer 60 using a spin-on process. Here, SOG typically flows into the second area L due to its high fluidity, making the SOG layer thicker in the second area L than in the first area H. Therefore, the SOG layer 70 tends to be relatively planar, and is thickest in a portion A of the area L adjacent to the first area H.

The SOG layer 70 is then baked at between 150 and 400° C. to remove solvents and moisture from the SOG layer 70. During this baking process, the thicker portion A of the SOG layer 70 tends to be more susceptible to fine cracks. Though fine cracks can be reduced by forming the SOG layer 70 of an organic SOG instead of an inorganic SOG, it is difficult to efficiently reduce the stress-induced fine cracks due to the thickness of the portion A of the SOG layer 70.

Referring to FIG. 2, a planarization layer 70a is formed by uniformly etching back the overall surface of the SOG layer 70 to a predetermined depth until the third insulation layer 60 on the third lower conductive pattern 50c is exposed. The reason for etch-back is to further planarize the surface of the SOG layer 70 and reduce the aspect ratio of a later-formed via hole.

Because the SOG layer 70 is thinner on the first lower conductive pattern 50a than on the third lower conductive pattern 50c, the third insulation layer 60 on the first lower conductive pattern 50a is typically exposed. However, because the SOG layer 70 is thicker on the second lower conductive pattern 50b than on the third conductive pattern 50c, the third insulation layer 60 on the second lower conductive pattern 50b typically is not exposed.

A fourth insulation layer 80 is then formed on the surface of the resultant structure. A photoresist layer pattern 90a is formed on the fourth insulation layer 80 to expose the fourth insulation layer 80 on the second and third lower conductive patterns 50b and 50c. Referring to FIG. 3, a fourth insulation layer pattern 80a having via holes for exposing the second and third lower conductive patterns 50b and 50c, respectively, a planarization layer pattern 70b, and a third insulation layer pattern 60a are formed by sequentially etching the fourth insulation layer 80, the planarization layer 70a, and the third insulation layer 60, using the photosensitive layer pattern 90a as an etching mask.

To simultaneously expose the second and third lower conductive patterns 50b and 50c, the upper portion of the second lower conductive pattern 50b typically is further etched. When etching is performed for the purpose of exposing the third lower conductive pattern 50c, the second lower conductive pattern 50b may not be exposed. On the other hand, when etching is performed for the purpose of exposing the second lower conductive pattern 50b, the upper portion of the third conductive pattern 50c may be over-etched, and the via hole for exposing the third lower conductive pattern 50c may become wider, potentially resulting in formation of a connection between the via hole and an adjacent via hole (not shown), or exposing another conductive layer which should not be exposed.

First and second upper conductive patterns 100a and 100b are then formed on the fourth insulation layer pattern 80a to make contact with the second and third lower conductive patterns 50b and 50c through the via holes, respectively.

If the SOG layer 70 is formed of an organic SOG to reduce fine cracks on the planarization layer 70a in area A, high molecular weight substances may be produced during forming the via hole for exposing the second lower conductive pattern 50b. These high molecular weight substances may locally accumulate on the second lower conductive pattern 50b, thereby increasing contact resistance. High molecular weight substances typically are formed because silicon (Si) and oxygen (O) components of the organic SOG are vaporized as silicon fluoride ($SiF_4$) and carbon dioxide ($CO_2$) during etching by a carbon fluoride ($CF_4$ or $C_2F_6$) etching gas, whereas organic components of the organic SOG are not removed.

According to the conventional method described above, the SOG planarization layer 70a in area A is susceptible to fine cracks. The second lower conductive pattern 50b may not make contact with the first upper conductive pattern 100a. In addition, the via hole exposing the third lower conductive pattern 50c may be larger than intended.

SUMMARY OF THE INVENTION

In light of the foregoing, it is an object of the present invention to provide interconnects for microelectronic devices and methods of fabrication therefor which have planarized spun-on-glass (SOG) regions which are less susceptible to formation of fine cracks and which are less likely to produce deformed via holes for interconnecting regions formed thereon.

These and other objects, features and advantages are provided according to the present invention by interconnects and methods of fabrication therefor in which a conductive mesa upon which an interconnect is to be formed is formed a sufficient distance from an adjacent mesa such that an overlying spun-on glass (SOG) planarization layer formed thereon is substantially removed from the interconnect mesa upon planarization of the SOG layer to form a planarized SOG region. Consequently, when an overlying insulation layer is formed on the interconnect mesa, via holes formed therethrough are less likely to be distorted. In addition, because of the separation between the mesas, the SOG layer tends to be thinner, thus helping reduce the formation of fine cracks therein.

In particular, according to the present invention, an interconnect in a microelectronic device is formed by forming a first mesa on a substrate. A first insulation layer is then formed on the substrate, the first insulation layer covering the first mesa to define a step at an edge thereof. A second mesa is formed on the first insulation layer adjacent the step, the second mesa being lower than the step. A second insulation layer is formed on the substrate, covering the second mesa and forming a step in the second insulation layer overlying the step in the first insulation layer. A spun-on-glass (SOG) layer is then formed on the second insulation layer, and then is planarized to expose a first portion of the second insulation layer at the step in the second insulation layer and to expose a second portion of the second insulation layer overlying the second mesa, thereby defining a planarized SOG region between the step and the second mesa. A third insulation layer is formed on the substrate, covering the planarized SOG region, and portions of the second and third insulation layers overlying the second mesa are then removed to expose a portion of the second mesa. An interconnecting region is formed on the second insulation layer which extends through the second and third insulation layers to contact the exposed portion of the second mesa.

According to a first embodiment of the present invention, a first conductive mesa is formed on a substrate, the first conductive mesa having a first thickness. A first insulation layer is then formed on the substrate, the first insulation layer covering the first conductive mesa to define a step at an edge thereof. A second conductive mesa is formed on the first insulation layer adjacent the step, the second conductive mesa being laterally disposed a distance from the first conductive mesa at least three (3) times greater than the first thickness and having a second thickness less than the first thickness. A second insulation layer is formed on the substrate, covering the second conductive mesa and forming a step in the second insulation layer overlying the step in the first insulation layer. A spun-on-glass (SOG) layer is formed on the second insulation layer and planarized to expose a first portion of the second insulation layer at the step in the second insulation layer and to expose a second portion of the second insulation layer overlying the second conductive mesa, thereby defining a planarized SOG region between the step and the second conductive mesa. A third insulation layer is formed on the substrate, covering the planarized SOG region, and portions of the second and third insulation layers overlying the second conductive mesa are removed to expose a portion of the second conductive mesa. A conductive interconnecting region is formed on the second insulation layer which extends through the second and third insulation layers to contact the exposed portion of the second conductive mesa. Preferably, the first thickness is in a range from 5000 Å to 10,000 Å, and the second thickness is less than two-thirds (⅔) of the first thickness.

According to a second embodiment of the present invention, a first conductive mesa is formed on a substrate, the first conductive mesa having a first thickness. A first insulation layer is formed on the substrate, the first insulation layer covering the first conductive mesa to form a step at an edge thereof. A conductive layer and a second conductive mesa having a second thickness less than the first thickness are then formed on the first insulation layer. The second conductive mesa is laterally disposed a distance from the first conductive mesa at least three (3) times greater than the first thickness. The conductive layer overlies the first mesa and extends over the step in the first insulation layer towards the second conductive mesa, and has an edge disposed past the first mesa towards the second conductive mesa a distance at least three (3) times greater than the first thickness. A second insulation layer is then formed covering the second conductive mesa and the conductive layer to form first a first step in the second insulation layer overlying the step in the first insulation layer and a second step in the second insulation layer overlying the edge of the conductive layer, the second step being nearer the second conductive mesa than the first step. A spun-on-glass (SOG) layer is formed on the second insulation layer, and then is planarized to expose respective portions of the second insulation layer at respective ones of the first and second steps in the second insulation layer and to expose a portion of the second insulation layer overlying the second conductive mesa, thereby forming a first planarized SOG region disposed between the second conductive mesa and second step in the second insulation layer and a second planarized SOG region disposed between the first and second steps in the second insulation layer. A third insulation layer is formed covering the first and second planarized SOG regions, and portions of the second and third insulation layers overlying the second conductive mesa are removed to expose a portion of the second conductive mesa. A conductive interconnecting region is formed on the second insulation layer which extends through the second and third insulation layers to contact the exposed portion of the second conductive mesa. Preferably, the first thickness is in a range from 5,000 Å to 10,000 Å, and the second thickness is less than two-thirds (⅔) of the first thickness.

According to a third embodiment of the present invention, a first conductive mesa is formed on a substrate, the first conductive mesa having a first thickness. A first insulation layer is then formed on the substrate, the first insulation layer covering the first conductive mesa to form a step at an edge thereof. A conductive layer and a second conductive mesa having a second thickness less than the first thickness are then formed on the first insulation layer. The second conductive mesa is laterally disposed a distance from the first conductive mesa a distance which is at least three (3) times greater than the first thickness. The conductive layer is disposed on the first mesa and has an edge disposed towards the second conductive mesa. A second insulation layer is formed covering the second conductive mesa and covering the conductive layer to form a first step in the second insulation layer overlying the edge of the conductive layer and a second step in the second insulation layer overlying the step in the first insulation layer, the second step being nearer the second conductive mesa than the first step. A spun-on-glass (SOG) layer is formed on the second insulation layer, and then is planarized to expose respective portions of the second insulation layer at respective ones of the first and second steps in the second insulation layer and to expose a portion of the second insulation layer overlying the second conductive mesa, thereby forming a first planarized SOG region disposed between the second conductive mesa and second step in the second insulation layer and a second planarized SOG region disposed between the first and second steps in the second insulation layer. A third insulation layer is formed covering the first and second planarized SOG regions, and portions of the second and third insulation layers overlying the second conductive mesa are removed to expose a portion of the second conductive mesa. A conductive interconnecting region is formed on the second insulation layer which extends through the second and third insulation layers to contact the exposed portion of the second conductive mesa. Preferably, the first thickness is in a range from 5,000 Å to 10,000 Å and the second thickness is less than two-thirds (⅔) of the first thickness.

According to a fourth embodiment of the present invention, a dummy mesa is formed on a substrate, and a first insulation layer is formed covering the dummy mesa. A first conductive mesa is formed on the first insulation layer on a first side of the dummy mesa, the first conductive mesa having a first thickness greater than the dummy mesa. A second insulation layer is formed on the substrate, the second insulation layer covering the first conductive mesa to form a step at an edge thereof. A second conductive mesa is formed on the second insulation layer on a side of the dummy mesa opposite of the first conductive mesa and a third conductive mesa is formed on the second insulation layer overlying the first conductive mesa, the second and third conductive mesas having a second thickness less than the first thickness. A third insulation layer is then formed on the substrate, covering the step in the second insulation layer and the second conductive mesa and forming a step in the third insulation layer overlying the step in the second insulation layer. A spun-on-glass (SOG) layer is formed on the third insulation layer, and then is planarized to expose a first portion of the third insulation layer at the step in the third insulation layer and to expose a second portion of the third insulation layer overlying the second conductive mesa, thereby defining a planarized SOG region between the step in the third insulation layer and the second conductive mesa. A fourth insulation layer is formed on the substrate, covering the planarized SOG region, and portions of the third and fourth insulation layers overlying the second conductive mesa are removed to expose a portion of the second conductive mesa. A conductive interconnecting region is formed on the fourth insulation layer that extends through the third and fourth insulation layers to contact the exposed portion of the second conductive mesa. Preferably, the first thickness is in a range from 5000 Å to 10,000 Å, and the second thickness is less than two-thirds (⅔) of the first thickness.

Microelectronic devices formed by the above-described techniques are also discussed.

BRIEF DESCRIPTION OF THE DRAWINGS

Some of the objects and advantages of the present invention having been stated, others will be more fully understood from the detailed description that follows and by reference to the accompanying drawings in which:

FIGS. 10–12 are cross-sectional views of intermediate fabrication products illustrating fabrication of an interconnect for a microelectronic device according to a third embodiment of the present invention.

DETAILED DESCRIPTION OF THE PREFERRED EMBODIMENTS

Figure 1:
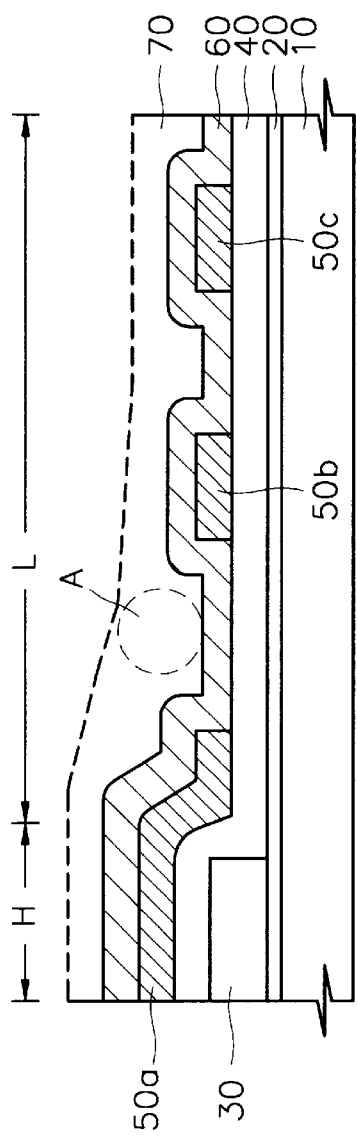
FIGS. 1–3 are cross-sectional views of intermediate fabrication products illustrating fabrication of an interconnect for a microelectronic device according to the prior art.
Figure 2:
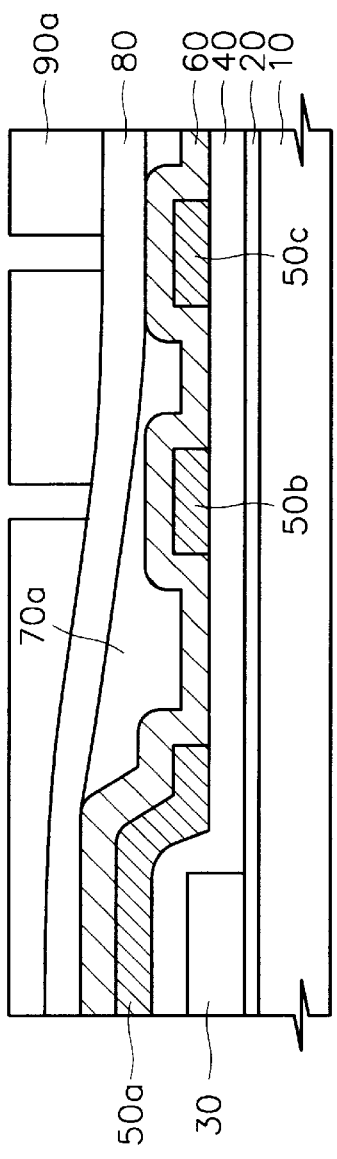
Figure 3:
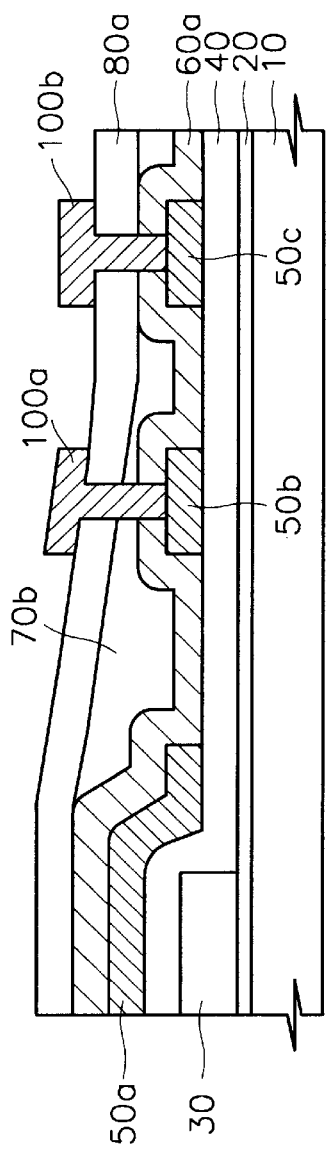

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, sizes and thicknesses of regions may be exaggerated for purposes of clarity, and like numbers refer to like elements throughout.

Figure 4:
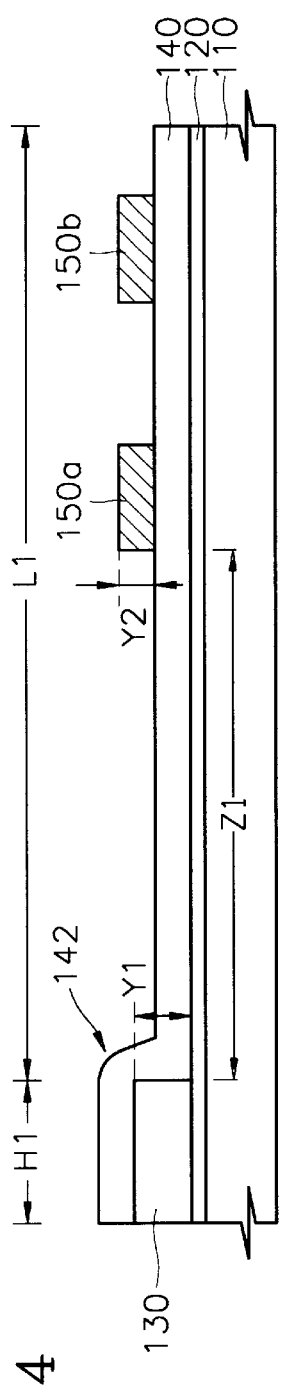
FIGS. 4–6 are cross-sectional views of intermediate fabrication products illustrating fabrication of an interconnect for a microelectronic device according to a first embodiment of the present invention.

FIG. 4 illustrates formation of a first insulation layer 120, a first conductive mesa 130, a second insulation layer 140, and second conductive mesas 150*a*–150*b*. First, the first conductive mesa 130 has a thickness of Y1, e.g., 5,000–10,000 Å, on the substrate 110, and is formed on a first insulation layer 120 having a thickness, for example, of 1,000–5,000 Å. The second insulation layer 140 is formed to a thickness, for example, of 1,000–5,000 Å. A step 142 is produced on the surface of the second insulation layer 140 due to the presence of the first conductive mesa 130. Therefore, the resultant structure is divided into a first area HI where the height between the surface of the substrate 110 and the surface of the second insulation layer 140 is relatively high, and a second area L1 where the height is relatively low. The second conductive mesas 150*a*–150*b* are formed on the second insulation layer 140 to a thickness of Y2 which is preferably two-thirds (⅔) of Y1 or less. The second conductive mesas 150a–150b may be formed by patterning a conductive layer formed on the second insulation layer 140 until the second insulation layer 140 is exposed. Preferably, the second conductive mesa 150a closest to the first conductive mesa 130 is separated from the first conductive mesa 130 by a distance Z1 which is at least three (3) times as large as the thickness Y1.

Figure 5:
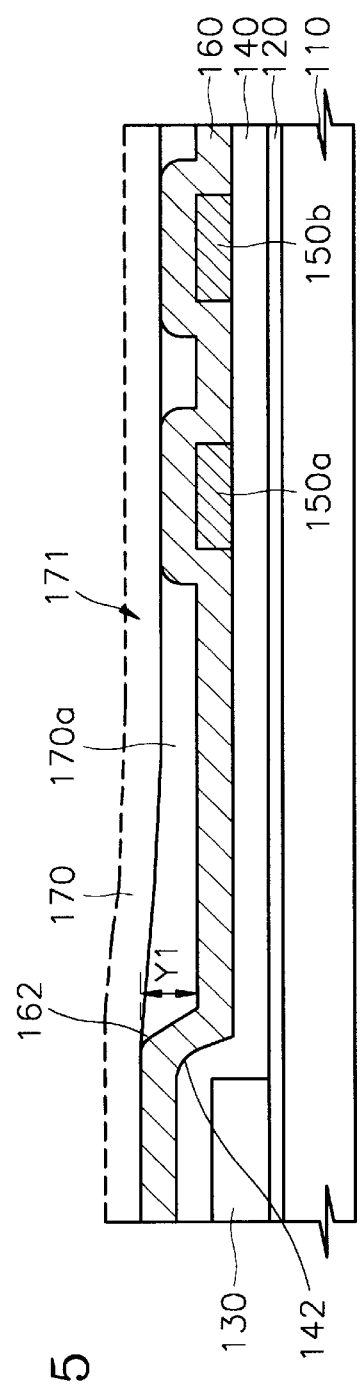

FIG. 5 illustrates forming a third insulation layer 160 and a spun-on glass (SOG) region 170a. The third insulation layer 160 is formed covering the second mesas 150a–150b, forming a step 162 overlying the step 142 in the second insulation layer 140. An SOG layer 170 is then formed by coating an inorganic or organic SOG on the third insulation layer 160 using a spin-on process. The SOG layer 170 is then baked at 150–400° C.

The planarized SOG region 170a is formed by etching back the SOG layer 170 until the third insulation layer 160 is exposed at the step 162 and overlying the second conductive mesa 150a closest to the first conductive mesa 130. Because the step 162 in the third insulation layer 160 is relatively small and the second conductive mesa 150a closest to the first conductive mesa 130 is separated from the first conductive mesa 130 by a distance of at least three (3) times the first thickness Y1, the SOG layer 170 on the second conductive mesa 150a is approximately as thick as that on the other second mesa 150b thus defining a substantially continuous surface 171 extending over the mesas 150a, 150b and the material therebetween. Therefore, when the third insulation layer 160 is exposed, little or none of the SOG layer 170 is left overlying the second mesa 150a.

The SOG layer 170 has a relative planar surface, and is thickest at the boundary of the second area L1 adjacent to the first area H1. However, the step 162 in the third insulation layer 160 is relatively low in comparison to the prior art. As a result, the SOG layer 170 formed at the boundary of the second area L1 adjacent to the first area H1 is relatively thin, and formation of fine cracks may be prevented during subsequent heat treatment, as well as during baking of the SOG layer 170.

Figure 6:
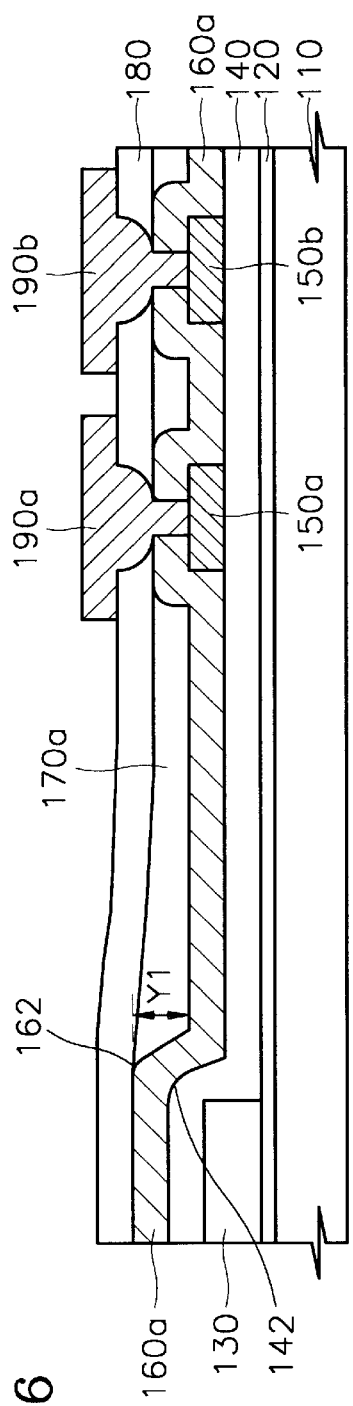

FIG. 6 illustrates forming a fourth insulation layer 180 and interconnecting regions 190a–190b. The fourth insulation layer is formed to cover the planarized SOG region 170a, preferably to a thickness of 4,000–7,000 Å. Portions of the fourth insulation layer 180 and the third insulation layer 160 overlying the second mesas 150a–150b are then removed to form via holes for exposing the second mesas 150a–150b by sequentially etching the fourth insulation layer 180 and the third insulation layer 160. Problems during formation of the via holes may be avoided because little or none of the SOG layer 170 remains on the second mesas 150a–150B. Interconnecting regions 190a–190b are then formed on the fourth insulation layer 180, extending through the third insulation layer 160 and the fourth insulation layer 180 to contact the second mesas 150a–150b through the via holes.

Figure 7:
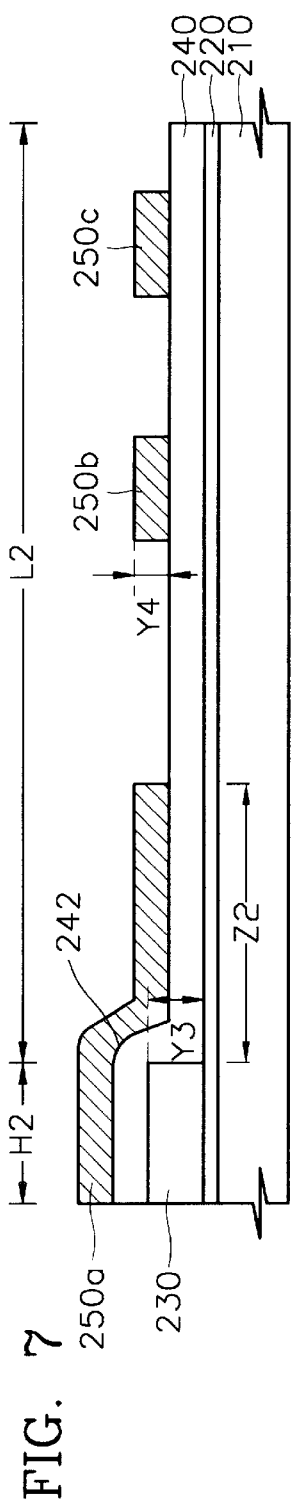
FIGS. 7–9 are cross-sectional views of intermediate fabrication products illustrating fabrication of an interconnect for a microelectronic device according to a second embodiment of the present invention.
Figure 8:
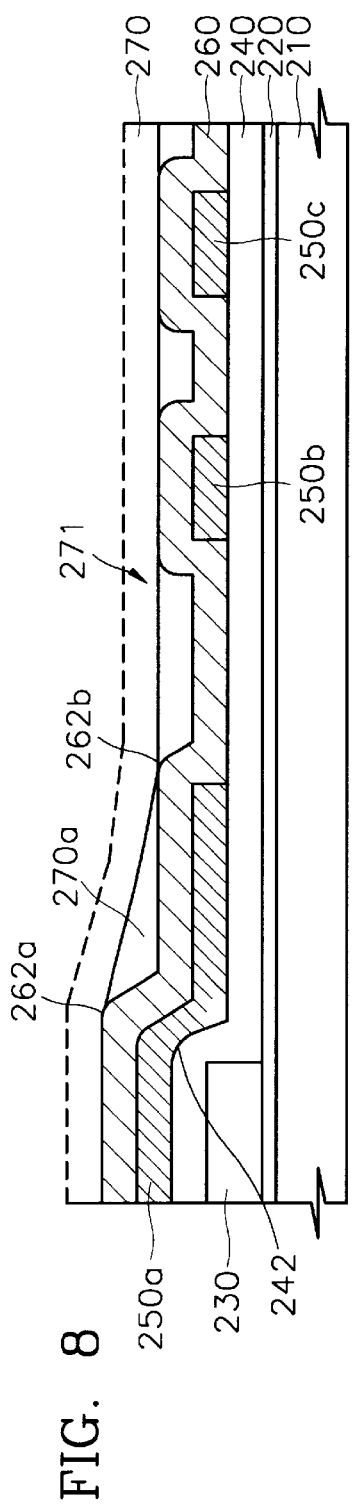
Figure 9:
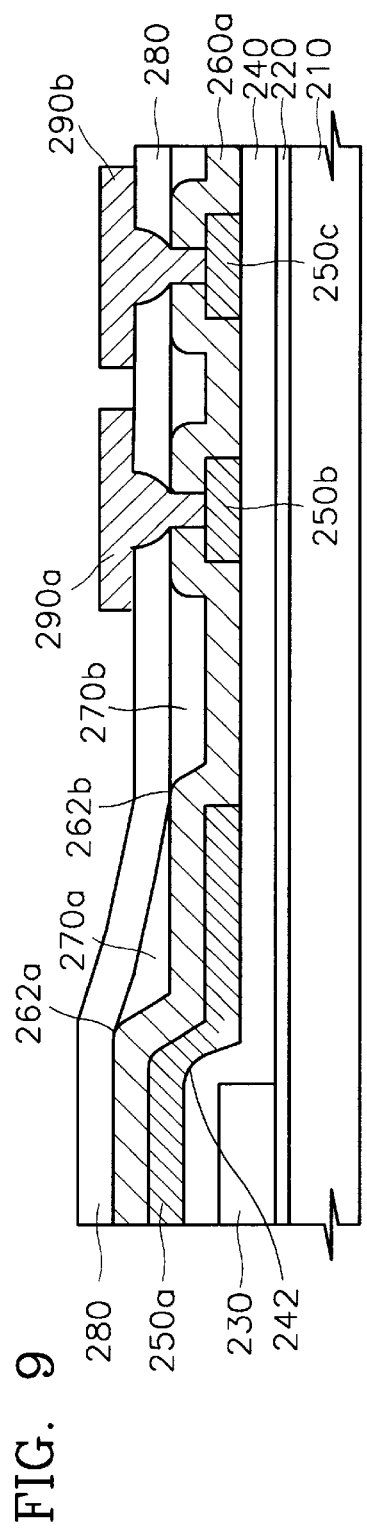

FIGS. 7, 8, and 9 are sectional views showing a method for forming a multilevel interconnects in a semiconductor device according to a second embodiment of the present invention. FIG. 7 illustrates forming a first insulation layer 220, a first conductive mesa 230, a second insulation layer 240, a conductive layer 250a, and second conductive mesas 250b–250c. A first conductive mesa 230 is formed to a thickness of Y3, e.g., 5,000–10,000 Å, on a substrate 210 which includes a first insulation layer 220 which is, for example, 1,000–5,000 Å, thick. A second insulation layer 240 is then formed, preferably to a thickness of 1,000–5,000 Å, on the resultant structure, producing a step 242 in the surface of the second insulation layer 240 due to the presence of the first conductive mesa 230. Consequently, the resultant structure is divided into a first area H2 where the height between the surface of the substrate 210 and the surface of the second insulation layer 240 is relatively high, and a second area L2 where the height is relatively low.

A conductive layer is then formed on the second insulation layer 240, preferably to a thickness of Y4 that is two-thirds (⅔) or less of the thickness Y3 of the first conductive mesa 230. The conductive layer is then patterned to form second conductive mesas 250b–250c and a conductive layer 250a which overlies the first conductive mesa 230 and extends over the step 242, past the first conductive mesa 230 a distance Z2 which is at least three (3) times the thickness Y3 of the first conductive mesa 230.

FIG. 8 illustrates forming a third insulation layer 260 and planarized SOG regions 270a–270b. The third insulation layer 260 is formed, covering the conductive layer 250a and the second conductive mesas 250b–250c, preferably to a uniform thickness. The presence of the first conductive mesa 230 and the conductive layer 250a causes the formation of first and second steps 262a, 262b in the third insulation layer 260.

A SOG layer 270 is then formed by coating an inorganic or organic SOG on the third insulation layer 260 using a spin-on process. The SOG layer 270 remains relatively thin in the second area L2, thus reducing the likelihood of formation of fine cracks on the SOG layer 270 during subsequent heat treatment, as well as during baking of the SOG layer 270.

The SOG layer 270 is then baked at 150–400° C., and first and second planarized SOG regions 270a–270b are formed by etching back the SOG layer 270 until the third insulation layer 260 is exposed at the steps 262a–262b therein. When the third insulation layer 260 is exposed, little or none of the SOG layer 270 remains on the second mesas 250b–250c, because the steps 262a–262b in the third insulation layer 260 are relatively small. The SOG region 270b and the third insulation layer 260 thus define a substantially continuous surface 271 extending over the mesas 230, 250b and the material therebetween.

FIG. 9 illustrates forming a fourth insulation layer 280, and conductive interconnecting regions 290a–290b. A fourth insulation layer is formed covering the SOC region 270a, preferably to a thickness of 3,000–7,000 Å. The fourth insulation layer 280 and the third insulation layer 260 are then patterned to form via holes for exposing the second mesas 250b–250c. As little or none of the SOG layer 270 remains on the second mesas 250b–250c, problems may be avoided during forming the via holes. Conductive interconnecting regions 290a–290b may then be formed on the fourth insulation layer 280, extending through the third and fourth insulation layers 260, 280 to make contact with the second conductive mesas 250b–250c.

FIGS. 10, 11, and 12 are sectional views showing a method for forming multilevel interconnects in a semiconductor device according to a third embodiment of the present invention. FIG. 10 illustrates forming a first insulation layer 320, a first conductive mesa 330, a second insulation layer 340, a conductive layer 350a and second conductive mesas 350b–350c. The first conductive mesa 330 is formed to a thickness of Y5, e.g., 5,000–10,000 Å, on a substrate 310 including a first insulation layer 320 formed thereon, for example, to a thickness of 1,000–5,000 Å. A second insulation layer 340 is formed, preferably to a thickness of 1,000–5,000 Å, on the overall surface of the resultant structure, forming a step 342 in the second insulation layer 340 at an edge of the first conductive mesa 330. Consequently, the resultant structure is divided into a first area H3 where the height between the surface of the substrate 310 and the surface of the second insulation layer 340 is relatively high, and a second area L3 where the height is relatively low.

A conductive layer is then formed on the second insulation layer 340 to a thickness of Y6 which preferably is less than two-thirds (⅔) of the thickness Y5 of the first conductive mesa 330. The conductive layer is then patterned to form second conductive mesas 350b–350c spaced laterally apart from the first conductive mesa 330, and a conductive layer 350a on the first conductive mesa 330. The second conductive mesa 350b closest to the first conductive mesa 330 is preferably separated from the first conductive mesa 330 by a distance Z3' which is at least three (3) times greater than the thickness Y5 of the first conductive mesa 330.

FIG. 11 illustrates forming a third insulation layer 360 and first and second planarized SOG regions 370a–370b. A third insulation layer 360 is formed to a predetermined thickness, covering the conductive layer 350a and the second mesas 350b–350c, and forming a first step 362a at an edge of the conductive layer 350a and a second step 362b overlying an edge of the first conductive mesa 330. An SOG layer 370 is then formed by coating an inorganic or organic SOG on the third insulation layer 360 using a spin-on process. Similar to the first embodiment, the SOG layer 370 is relatively thin in the second area L3 adjacent to the first area H1, thereby helping prevent formation of fine cracks on the SOG layer 370 during subsequent heat treatment, as well as during baking of the SOG layer 370.

First and second planarized SOG regions 370a–370b are then formed by baking the SOG layer 370 at 150–400 ° C., and then etching the SOG layer 370 until the third insulation layer 360 is exposed at the steps 362a–362b and overlying the second conductive mesa 350b. Because of the separation between the first conductive mesa 330 and the second conductive mesa 350b closest thereto, little or none of the SOG layer 370 remains on the second conductive mesa 350b.

FIG. 12 illustrates forming a fourth insulation layer 380 and conductive interconnecting regions 390a–390b. The fourth insulation layer 380 is formed on the planarized SOG region 370a to a thickness, for example, of 3,000–7,000 Å. Portions of the third insulation layer 360 and the fourth insulation layer 380 are removed to expose the second conductive mesas 350b–350c. Conductive interconnecting regions 390a–390b are then formed on the fourth insulation layer 380 to make contact with the second conductive mesas 350b–350c.

Figure 13:
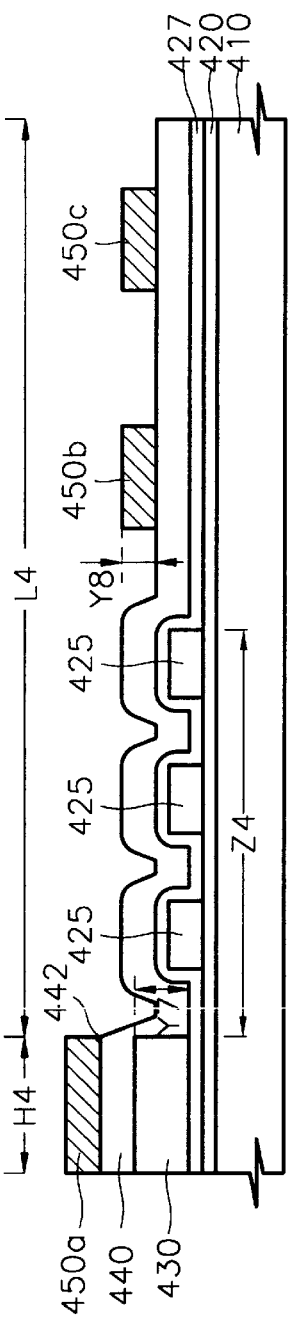
FIGS. 13–15 are cross-sectional views of intermediate fabrication products illustrating fabrication of an interconnect for a microelectronic device according to a fourth embodiment of the present invention.
Figure 14:
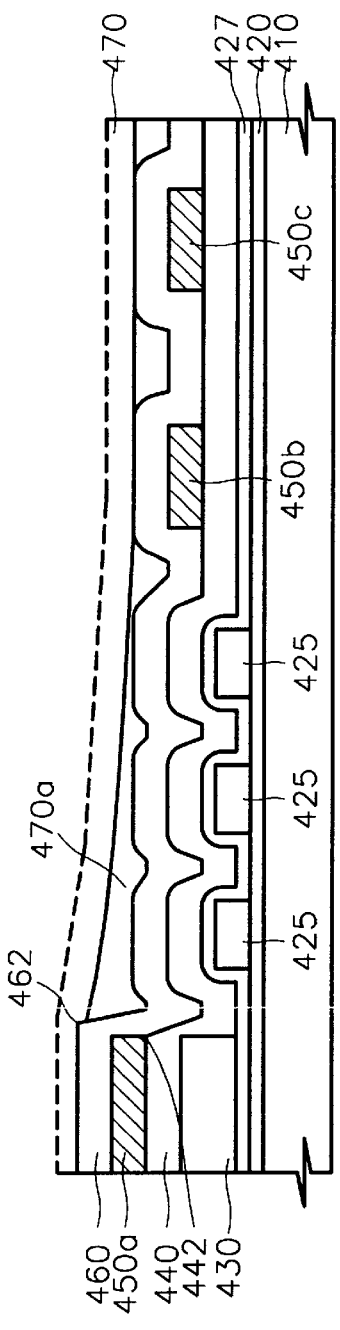
Figure 15:
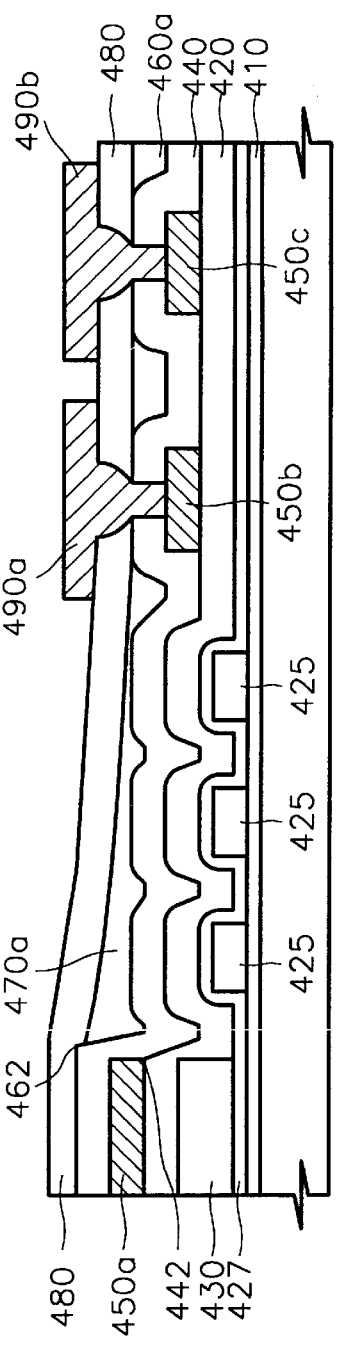

FIGS. 13, 14, and 15 are sectional views showing a method for forming multilevel interconnects in a semiconductor device according to a fourth embodiment of the present invention. FIG. 13 illustrates forming a first insulation layer 420, dummy mesas 425, a second insulation layer 427, a first conductive mesa 430, a third insulation layer 440, second conductive mesas 450b–450c, and a third conductive mesa 450a. Dummy mesas 425 are formed to a thickness, for example, of 1,000–5,000 Å, on a substrate 410 including a first insulation layer 420 thereon having a thickness, for example, of 1,000–5,000 Å. The dummy mesas 425 may be integrated. A second insulation layer 427 may then be formed to a thickness, for example, of 1,000–5,000 Å. A first conductive mesa 430 is then formed on a first side of the dummy mesas 425 to a thickness Y7 of, for example, 5,000–10,000 Å, which is larger than the thickness of the dummy patterns 425. The first conductive mesa 430 preferably is separated from the farthest dummy pattern 425 by a distance (Z4) which is at least three (3) times the thickness Y7.

A third insulation layer 440 is formed on the resultant structure, forming a step 442 at an edge of the first conductive mesa 430. Consequently, the resultant structure is divided into a first area H4 where the height between the surface of the substrate 410 and the surface of the third insulation layer 440 is relatively high, and a second area L4 where the height is relatively low.

A conductive layer is then formed on the third insulation layer 440 to a thickness Y8 which is preferably less than two-thirds (⅔) of the thickness Y7 of the first conductive mesa 430. The conductive layer is then patterned to form second conductive mesas 450b–450c on an opposite side of the dummy mesas 425 from the first conductive mesa 430, and a third conductive mesa 450a overlying the first conductive mesa 430.

Referring to FIG. 14, a fourth insulation layer 460 is formed, preferably to a uniform thickness, thus forming a step 462 overlying the step 442 in the third insulation layer 440. An SOG layer 470 is then formed by coating an inorganic or organic SOG on the fourth insulation layer 460 using a spin-on process. The SOG layer 470 formed in the second area L4 tends to be relatively thin, helping reduce the likelihood of formation of fine cracks on the SOG layer 470 during subsequent heat treatment, as well as during baking of the SOG layer 470.

The SOG layer 470 is baked at 150–400° C., and then etched back until the fourth insulation layer 460 is exposed at the step 462 and overlying the second conductive mesa 450b. Since the second conductive mesa 450b closest to the first conductive mesa 430 is sufficiently separated from the first conductive mesa 430, little or none of the SOG layer 470 remains on the second conductive mesa 450b.

FIG. 15 illustrates forming a fifth insulation layer 480 and interconnecting conductive regions 490a–490b. The fifth insulation layer is formed on the planarized SOG region 470a to a thickness, for example, of 3,000–7,000 Å. Portions of the fourth insulation layer 460 and the fifth insulation layer 480 are then removed to expose the second conductive mesas 450b–450c. Because little or none of the SOG layer 470a remains on the second conductive mesas 450b–450c, conventional problems may be avoided during formation of the via holes. Interconnecting conductive regions 490a–490b are then formed on the fifth insulation layer 480, extending through the fourth and fifth insulation layers 460, 480 to contact the second conductive mesas 450b–450c through the via holes.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A microelectronic device, comprising:
   a substrate;
   a first mesa on said substrate;
   a first insulation layer on the substrate, the first insulation layer covering the first mesa to form a step at an edge thereof;

a second mesa on the first insulation layer adjacent the step, the second mesa being lower than the step;

a second insulation layer on the substrate, covering the first mesa and the second mesa and having a first step in the second insulation layer overlying the step in the first insulation layer and a second step in the second insulation layer overlying an edge of the second mesa;

a spun-on glass (SOG) region on the second insulation layer and disposed between the first and second steps in the second insulation layer, wherein the second insulation layer and the SOG region define a substantially continuous surface extending over the first mesa, the second mesa and material disposed between the first and second mesas;

a third insulation layer on the substantially continuous surface defined by the second insulation layer and the SOG region, wherein the second mesa is sufficiently separated from the first mesa such that the third insulation layer contacts the second insulation layer over substantially all of the second mesa; and an interconnecting region on the third insulation layer which extends through the third and second insulation layers to contact the second mesa.

2. A device according to claim 1, wherein the first mesa and the second mesa are separated by a distance at least three (3) times greater than the thickness of the first mesa.

3. A device according to claim 1, wherein the first mesa has a first thickness, and wherein the second mesa has a second thickness which is less than two-thirds (⅔) of the first thickness.

4. A device according to claim 3, wherein the first and second mesas are laterally separated by a distance at least three (3) times greater than the first thickness.

5. A device according to claim 4, wherein the second mesa and the interconnecting region each comprise a conductive material.

6. A device according to claim 1, further comprising a microelectronic layer on the first insulation layer, overlying the first mesa, the microelectronic layer having an edge disposed toward the second mesa, and wherein the second insulation layer covers the edge of the microelectronic layer such that a third step in the second insulation layer overlies the edge of the microelectronic layer, on a side of the first step in the insulation layer opposite the second step in the second insulation layer;

wherein the SOG region comprises a first SOG region disposed between the first and second steps in the second insulation layer and a second SOG region disposed between the first and third steps in the second insulation layer; and wherein the third insulation layer covers the first and second SOG regions.

7. A device according to claim 6, wherein the second mesa, the microelectronic layer and the interconnecting region each comprise a conductive material.

8. A device according to claim 6, wherein the first mesa has a first thickness, and wherein the second mesa has a second thickness which is less than two-thirds (⅔) of the first thickness.

9. A device according to claim 8, wherein the first mesa and the second mesa are separated by a distance at least three (3) times greater than the first thickness.

10. A device according to claim 1, further comprising a microelectronic layer on the first insulation layer, overlying the first mesa and extending over the step in the first insulation layer towards the second mesa, and wherein the second insulation layer covers the edge of the microelectronic layer such that a third step in the second insulation layer overlies the edge of the microelectronic layer, between the first and second steps in the second insulation layer;

wherein the SOG region comprises a first SOG region disposed between the first and third steps in the second insulation layer and a second SOG region disposed between the second and third steps in the second insulation layer; and wherein the third insulation layer covers the first and second SOG regions.

11. A device according to claim 1, wherein the first mesa has a first thickness, and wherein the second mesa has a second thickness which is less than two-thirds (⅔) of the first thickness.

12. A device according to claim 11, wherein the microelectronic layer extends past the first mesa towards the second mesa a distance at least three (3) times greater than the first thickness.

13. A device according to claim 1, further comprising:

a dummy mesa on the substrate between the first and second mesas, the first mesa having a thickness greater than the dummy mesa; and a third conductive mesa on the first insulation layer, overlying the first conductive mesa; and wherein said first insulation layer covers the dummy mesa.

14. A microelectronic device, comprising:

a substrate;

a structure on the substrate, the structure having a series of steps defined therein, wherein a respective step of the series of steps of the structure has a respective height and is separated from an adjacent lower step by a distance at least three times as great as the height of the respective step;

a first insulation layer conforming to the structure such that respective steps of a series of steps in the first insulation layer overlie respective steps of the series of steps of the structure;

a plurality of spun-on glass (SOG) regions on the insulation layer, a respective one of which is disposed between a respective pair of adjacent steps in the first insulation layer.

15. A device according to claim 14, further comprising:

a mesa on the substrate adjacent the structure, wherein said first insulation layer covers the mesa, forming one step in the first insulation layer at an edge of the mesa; and an SOG region disposed between a step in the first insulation layer overlying a step of the structure nearest the mesa and the one step in the second insulation layer overlying the edge of the mesa.

16. A device according to claim 15, further comprising:

a second insulation layer on the first insulation layer and the SOG region that contacts the first insulation layer over substantially all of the mesa; and an interconnecting region on the second insulation layer which extends through the second and first insulation layers to contact the mesa.

17. A device according to claim 16, wherein the structure, the mesa and the interconnecting region comprise a conductive material.

* * * * *

UNITED STATES PATENT AND TRADEMARK OFFICE
CERTIFICATE OF CORRECTION

PATENT NO.     :     6,072,225

DATED          :     June 6, 2000

INVENTOR(S)    :     Chang et al.

It is certified that error appears in the above-identified patent and that said Letters Patent is hereby corrected as shown below:

[56] Please add the following references:

U.S. Patent Documents
5,584,964       12/17/96        Umimoto et al.          156     657.1
5,403,780       04/04/95        Jain et al.             437     195

Foreign Patent Documents
0 498 521 A1    12/08/92        Europe
0 388 862 A2    09/26/90        Europe
07078818        03/20/95        Japan Other Documents
European Search Report, EP 97 30 6422, October 16, 1998

Signed and Sealed this

Third Day of April, 2001

NICHOLAS P. GODICI

Attest:

Attesting Officer

Acting Director of the United States Patent and Trademark Office